United States Patent [19]
Shibata et al.

[11] Patent Number: 5,965,908
[45] Date of Patent: Oct. 12, 1999

[54] EPITAXIAL WAFER AND MANUFACTURING METHOD THEREOF AS WELL AS LIGHT-EMITTING DIODE WITH ENHANCED LUMINANCE

[75] Inventors: Yukiya Shibata; Seiji Mizuniwa; Toshiya Toyoshima, all of Hitachi, Japan

[73] Assignee: Hitach Cabel, Ltd., Tokyo, Japan

[21] Appl. No.: 08/991,013

[22] Filed: Dec. 15, 1997

[30]     Foreign Application Priority Data

Jan. 29, 1997 [JP] Japan ................................. 9-014936

[51] Int. Cl.$^6$ .............................. H01L 33/00; H01S 3/19
[52] U.S. Cl. ................................. 257/94; 257/102; 372/46
[58] Field of Search ............................... 257/66, 79, 82, 257/94, 102; 372/45, 46

[56]            References Cited

U.S. PATENT DOCUMENTS 5,661,741  8/1997  Kakimoto ................................. 372/46
5,789,773  8/1998  Takeoka et al. ......................... 257/101

*Primary Examiner*—Brian Dutton
*Attorney, Agent, or Firm*—Antonelli, Terry, Stout & Kraus, LLP

[57]            ABSTRACT

An epitaxial semiconductor crystal plate or wafer capable of attaining increased reliability with enhanced luminance, a manufacturing method thereof as well as a light-emitting diode (LED). It has been found that epitaxial wafers with enhanced illuminance and increased yield of manufacture can be fabricated by specifically arranging a double-heterostructure epitaxial wafer such that the interface between its p-type clad layer 2 and p-type GaAlAs active layer 3 and that between an n-type GaAlAs clad layer 4 and p-type GaAlAs active layer 3 measure $1 \times 10^{17}$ cm$^{-3}$ or less in oxygen concentration. Also, in order to cause the oxygen concentration near the p-type GaAlAs active layer 3 in layers of the epitaxial wafer to be less than or equal to $1 \times 10^{17}$ cm$^{-3}$, it may be preferable that a nondoped GaAs polycrystal for use as a preselected original material in liquid-phase epitaxial growth be less than or equal to $1 \times 10^{16}$ cm$^{-3}$ or thereabout.

8 Claims, 3 Drawing Sheets

EPITAXIAL WAFER AND MANUFACTURING METHOD THEREOF AS WELL AS LIGHT-EMITTING DIODE WITH ENHANCED LUMINANCE

BACKGROUND OF THE INVENTION

The present invention generally relates to optical semiconductor microelectronics, and more particularly to epitaxial crystal multilayer structures and a manufacturing method thereof. The invention also relates to semiconductor light-emitting devices with enhanced light emission output intensity.

In recent years, red light-emitting diodes (LEDs) have become more widely used in the manufacture of electronic equipment. Several types of LEDs have been developed to date. A double-heterostructure LED is one example. A rear-surface reflection LED is another example. These LEDs come with enhanced luminance, and hence offer extended usability and applicability, such as for use with indoor lamps and display devices, as well as outdoor display devices.

However, in spite of the foregoing advances in this technology, it is also true that there are continuous demands for a further increase in luminance and a further decrease in manufacturing cost. To satisfy such demands, great efforts have been made to study several subjects involving the film thickness of the epitaxial layer, the carrier density or concentration, the crystal growth temperature settings, and other factors. Unfortunately, no efforts have been reported as being successful in demonstrating significant advantages leading to accomplishment of further improvements luminance at least at present.

For these reasons, it still remains difficult to meet luminance specifications as demanded, which in turn makes it difficult to provide an improvement in the manufacturing yield, while reducing the costs therefor.

In view of the foregoing, it may be appreciated by those skilled in the semiconductor art that there remains an unmet need for an epitaxial wafer capable of offering highly enhanced luminance with increased stability and reliability, along with an improved manufacturing method, as well as a light-emitting diode using the same.

SUMMARY OF THE INVENTION

It is therefore an object of the present invention to provide an improved optical semiconductor structure which avoids the problems encountered with the prior art.

It is another object of the invention to provide an epitaxial wafer structure which is capable of increased performance and reliability.

It is yet another object of the invention to provide an improved method of forming an epitaxial multilayer lamination wafer which is capable of increased light emission output and reliability while reducing the complexity of manufacture and the costs therefor.

It is still another object of the invention to provide an improved light-emitting device which is capable of increased light emission output and reliability while reducing the complexity of manufacture and the costs therefor.

It is a further object of the invention to provide a high-performance/high-reliability light-emitting multilayer epitaxial semiconductor device structure which is capable of maximizing the output light luminance characteristics and light emission stability, while reducing the complexity and costs.

To attain the foregoing objects, in accordance with one aspect of the present invention, a double-heterostructure epitaxial crystal plate or wafer is provided which has on its p-type compound semiconductor substrate a multilayer lamination including a p-type compound semiconductor clad layer, a p-type compound semiconductor active layer and a n-type compound semiconductor clad layer which are sequentially formed by liquid-phase epitaxial growth techniques. Each interface between the p-type compound semiconductor clad layer and p-type compound semiconductor active layer and between the p-type compound semiconductor active layer and n-type compound semiconductor clad layer measures $1 \times 10^{17}$ atoms per cubic centimeter ($cm^{-3}$) or less in oxygen concentration.

With such specific numerical control of the oxygen concentration near or around the active layer, it becomes possible to adjust the light emission output intensity, which in turn ensures that the light output intensity decreases with an increase in oxygen concentration, whereas it increases with a decrease in oxygen concentration. Accordingly, letting the oxygen concentration be set at $1 \times 10^{17}$ $cm^{-3}$ may enable the light emission luminance to increase by 30%, or more or less, as compared with the prior art. Preferably, the compound semiconductor materials for use in forming the multilayer wafer structure may be gallium arsenide (GaAs), gallium phosphide (GaP), gallium indium phosphide (GaInP), or equivalents thereto. Note here that the principles of the invention may also be applicable to epitaxial wafers with a rear-surface reflection structure, which eliminates use of the p-type compound semiconductor substrate from the multilayer structure mentioned supra.

In accordance with a further aspect of the invention, the foregoing double-heterostructure epitaxial wafer may be fabricated or manufactured by a specific method as follows. While employing a non-doped compound semiconductor polycrystalline having an oxygen density or concentration less than or equal to $1 \times 10^{16}$ $cm^{-3}$, sequentially grow by liquid-phase epitaxial techniques a p-type compound semiconductor clad layer, a p-type compound semiconductor active layer and an n-type compound semiconductor clad layer on a p-type compound semiconductor substrate in this order. During fabrication, each interface between the p-type compound semiconductor clad layer and p-type compound semiconductor active layer and the interface between the p-type compound semiconductor active layer and n-type compound semiconductor clad layer are specifically set to be less than or equal to $1 \times 10^{17}$ $cm^{-3}$ in oxygen concentration. With such a fabrication technique, it is possible to manufacture a high-performance epitaxial wafer having a maximized light emission luminance with increased production yield and reduced costs.

These and other objects, features and advantages of the invention will be apparent from the following more particular description of preferred embodiments of the invention, as illustrated in the accompanying drawings.

DETAILED DESCRIPTION OF THE INVENTION

Figure 1:
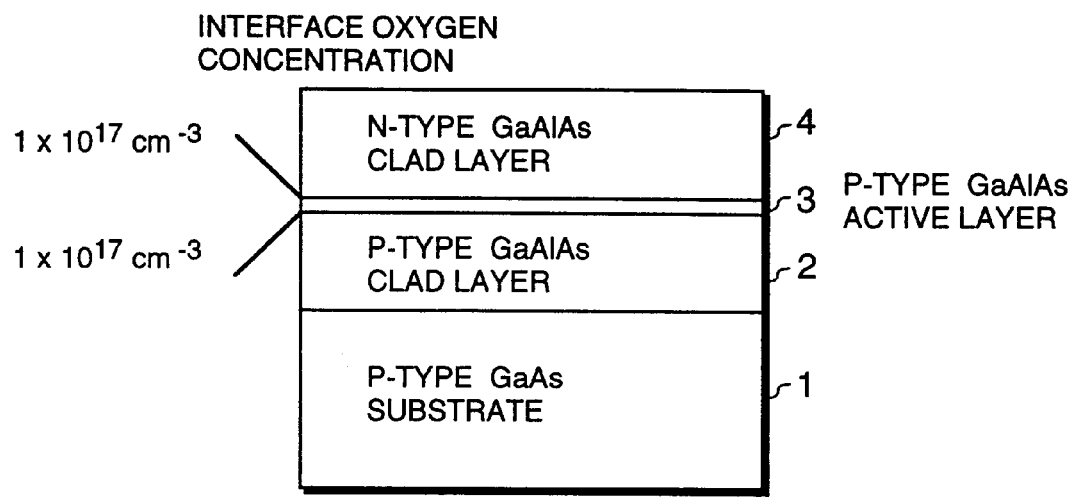
FIG. 1 is a diagram showing in cross sect a double-heterostructure epitaxial wafer in accordance with one embodiment of the invention.

Some preferred embodiments of the present invention will now be described with reference to the accompanying figures of the drawing. In the illustrative embodiments, a double-heterostructure epitaxial wafer and an epitaxial wafer with rear-surface reflection structure are specifically configured in structure so as to increase the luminance by approximately 30% as compared with the prior art thus attaining highly enhanced luminance characteristics.

Referring now to FIG. 1, a double-heterostructure epitaxial wafer in accordance with one preferred embodiment of the invention is illustrated in cross section. As shown in FIG. 1, the double-heterostructure epitaxial wafer includes a p-type GaAs substrate 1 on which a p-type GaAlAs clad layer 2 is formed. Formed on this GaAlAs clad layer 2 is a p-type GaAlAs active layer 3 having a surface on which an n-type GaAlAs clad layer 4 is formed.

Figure 2:
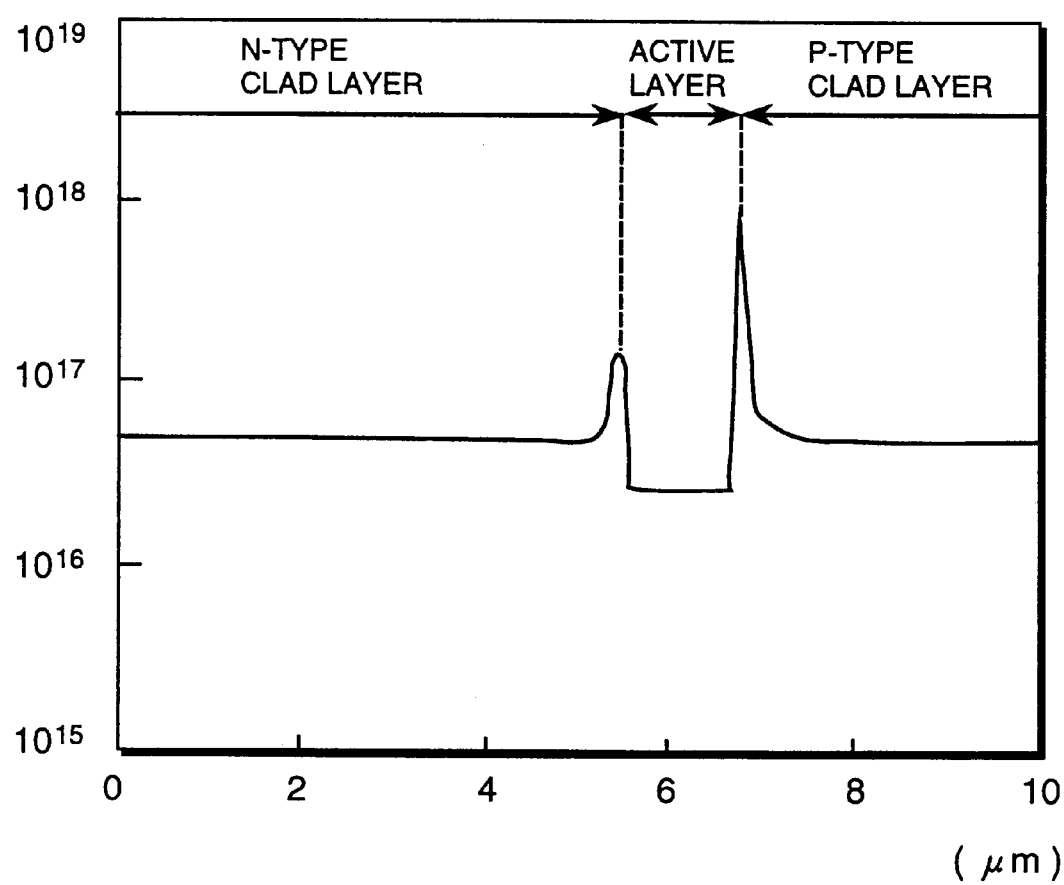
FIG. 2 is a graphical representation showing a distribution of oxygen concentration near an active layer of one prior art double-heterostructure epitaxial wafer.

FIG. 2, is a graph showing the distribution of oxygen concentration near the p-type GaAlAs active layer 3 of the aforesaid double-heterostructure epitaxial wafer. The measurements of the distribution shown herein were done in such a way that the secondary ion mass spectroscopy (SIMS) method was employed to measure the oxygen concentration along the depth of epitaxial layers. This SIMS method is such that each specimen or sample is doped and hit with primary ions having an energy ranging from several kilovolts (kV) to 20 kV at minute points or "micropoints" thereof causing a surface material to be sputter-ionized, thereby to permit analysis using mass analyzer equipment.

The measurement results reveal the fact that a peak of oxygen concentration measuring $1 \times 10^{18}$ atoms per cubic centimeter ($cm^{-3}$) or thereabound exists at the interface region between the p-type GaAlAs clad layer 2 and p-type GaAlAs active layer 3 while a similar peak of $2 \times 10^{17}$ $cm^{-3}$ or near is present at the interface between the n-type GaAlAs clad layer 4 and the GaAlAs active layer 3.

It has also been found that in this double-heterostructure epitaxial wafer, it is possible, by specifically setting at $1 \times 10^{17}$ $cm^{-3}$ or less the oxygen concentration at or near the interface between the p-type GaAlAs clad layer 2 and p-type GaAlAs active layer 3, as well as the oxygen concentration at or near the interface between n-type GaAlAs clad layer 4 and p-type GaAlAs active layer 4, to attain an epitaxial wafer with enhanced luminance and increased manufacturing yield.

It has further been found that in order to let the oxygen concentration inside the epitaxial wafer layers be less than or equal to $1 \times 10^{17}$ $cm^{-3}$, it may be recommendable to employ, as a preselected original material for use in liquid-phase epitaxial growth, a nondoped GaAs polycrystalline material which measures $1 \times 10^{16}$ $cm^{-3}$ or less in oxygen concentration. It has moreover been found that an increase in flow rate of ambient gas—here, hydrogen gas—is preferable.

Actually reduced embodiments incorporating the principles of the invention will be described in detail hereinafter. First of all, some preferred embodiment will be explained in a case where in order to fabricate a 660-nm wavelength double-heterostructure LED, epitaxial wafers are prepared by changing among various values the oxygen concentration at the interface between the p-type GaAlAs clad layer 2 and p-type GaAlAs active layer 3.

Prepare a graphite board. Set on this board a p-type GaAs substrate along with several original materials constituting respective LED layers. Then, put the resulting broad structure into a liquid-phase epitaxial furnace. By way of example, these layer materials may first include a p-type clad layer material for setting Ga, GaAs polycrystal, Al and Zn. Secondly, the materials may include a p-type active layer material for setting Ga, GaAs polycrystal, Al and Zn. Furthermore, they may include an n-type clad layer material for setting Ga, GaAs polycrystal, Al and Te.

Then, heat structure in the atmosphere of hydrogen gas up to a predetermined temperature of 950° C., for example. Next, control the furnace temperature to drop down at a predefined falling rate of 1.0° C. per minute thereby sequentially forming on the p-type GaAs substrate the following three layers: a p-type GaAlAs clad layer 2 grown to a thickness of 25 micrometers (sum); an overlying p-type GaAlAs active layer 3 grown to a thickness of 1 Mm; and a further overlying n-type GaAlAs clad layer 4 grown to a thickness of 40 μm.

With the epitaxial growth method stated above, seven pieces (seven rots) of epitaxial wafers were prepared which were $1 \times 10^{18}$ $cm^{-3}$, $8 \times 10^{17}$ $cm^{-3}$, $6 \times 10^{17}$ $cm^{-3}$, $4 \times 10^{17}$ $cm^{-3}$, $2 \times 10^{17}$ $cm^{-3}$, $1 \times 10^{17}$ $cm^{-3}$ and $8 \times 10^{16}$ $cm^{-3}$ in oxygen concentration at the interface between the p-type GaAlAs clad layer 2 and p-type GaAlAs active layer 3.

The oxygen concentration was adjusted in value by use of GaAs polycrystals having different flow rates of hydrogen gas flowing inside of the furnace and being in oxygen concentration. Thereafter, appropriate electrodes are formed on a respective one of the resultant crystal-grown epitaxial wafers. Finally, resin-molding is performed thereby to complete the LEDs.

Figure 3:
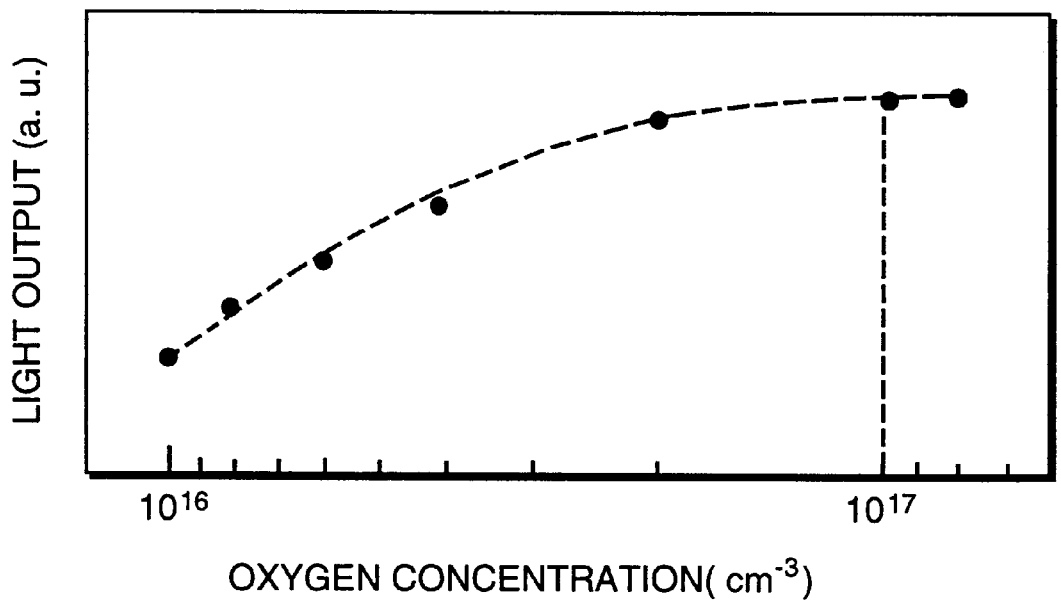
FIG. 3 is a graph showing a relation of light emission output versus the oxygen concentration of the interface between adjacent clad and active layers of a double-heterostructure epitaxial wafer embodying the invention.

FIG. 3 is a characteristic diagram demonstrating the relation of light emission output of the LEDs thus manufactured versus oxygen concentration. This was measured with its forward current If set at 20 milliamperes (mA). In the graph of FIG. 3, the light emission output increases with a decrease in oxygen concentration at the interface between the p-type GaAlAs clad layer 2 and p-type GaAlAs active layer 3; and when the concentration is at $1 \times 10^{17}$ $cm^{-3}$, the light emission output is held substantially constant.

When compared with an LED with oxygen concentration of $1 \times 10^{18}$ $cm^{-3}$, this embodiment offered a 30%-increase in light emission luminance. To render such interface oxygen concentration less than or equal to $1 \times 10^{17}$ $cm^{-3}$, use of a specific GaAs polycrystal is required in which the concentration of oxygen content is not greater than $1 \times 10^{16}$ $cm^{-3}$.

Figure 4:
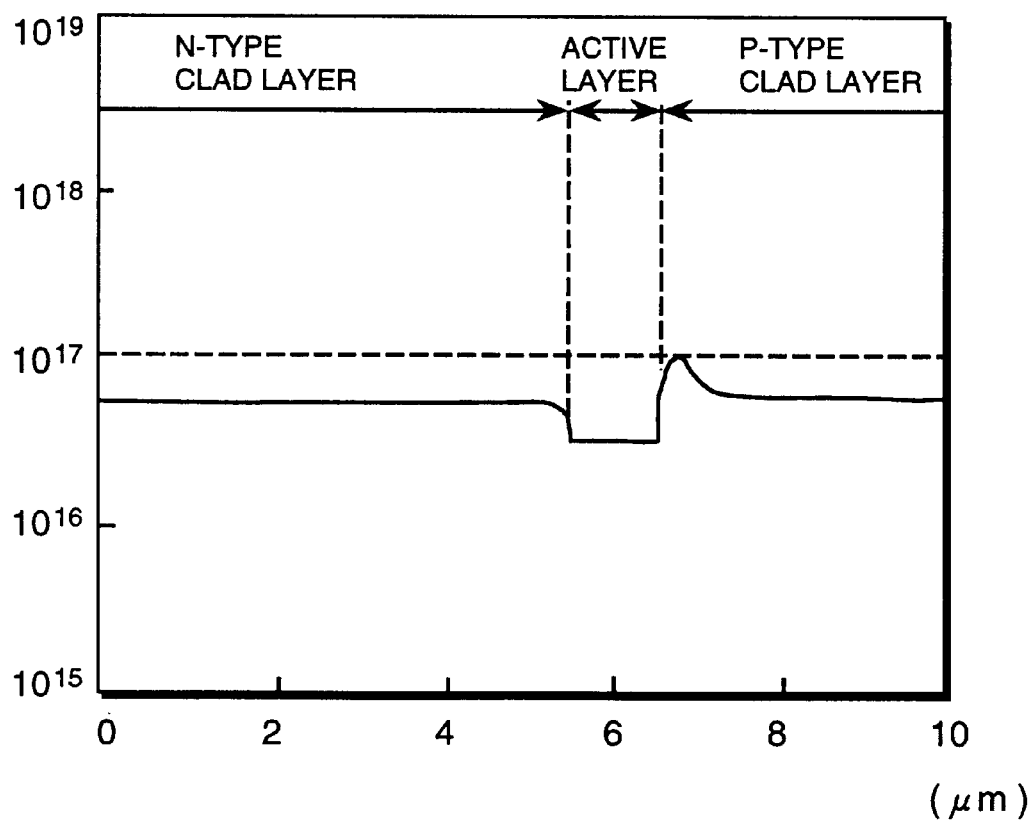
FIG. 4 is a graph showing a distribution of oxygen concentration near an active layer of the double-heterostructure epitaxial wafer embodying the invention.

See FIG. 4. This graph demonstrates an SIMS analysis result with regard to an LED as manufactured to be less than or equal to $1 \times 10^{17}$ $cm^{-3}$ in oxygen concentration at the interface thereof. In the graph of FIG. 4, the oxygen concentration at both interfaces—i.e. the interface between p-type GaAlAs clad layer 2 and p-type GaAlAs active layer 3, and that between n-type GaAlAs clad layer 4 and p-type GaAlAs active layer 3—were $1 \times 10^{17}$ $cm^{-3}$ or less.

With such an arrangement, it becomes possible to successfully control the light emission output by adjusting the oxygen concentration near or around the p-type GaAlAs active layer 3. This may enable highly efficient manufacture of LED devices which are enhanced by 30% or more in light emission output intensity, as compared with the prior art LEDs, while at the same time increasing the yield of production and reducing the manufacturing costs.

Figure 5:
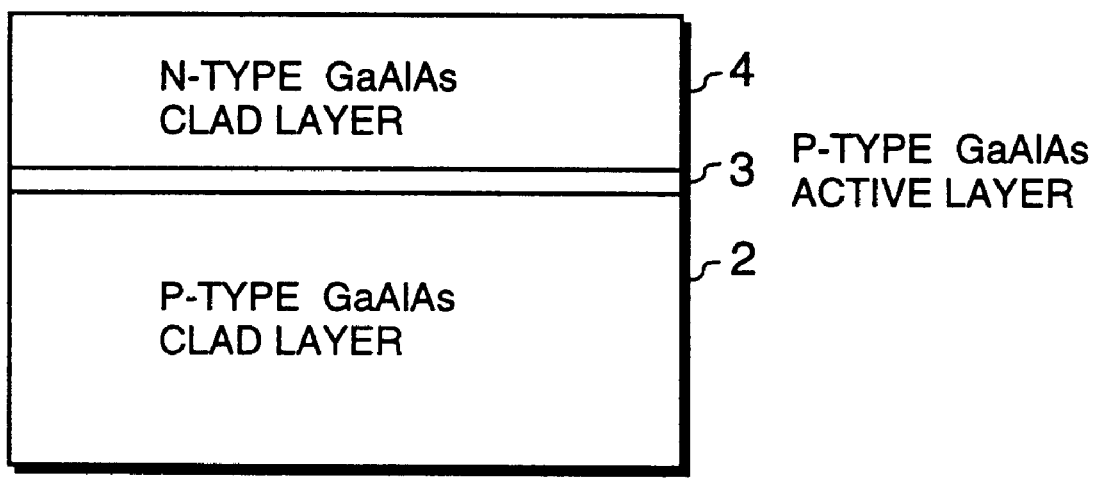
FIG. 5 is a diagram showing, in cross-section, a rear-surface reflection epitaxial wafer in accordance with a further embodiment of the invention.

Turning now to FIG. 5, a rear-surface reflection epitaxial wafer in accordance with a further embodiment of the invention is shown. The wafer is similar in structure to that shown in FIG. 1 with the p-type GaAs substrate 1 being removed away. With such an LED structure also, the resultant luminance was capable of being increased by approximately 30%.

In the foregoing illustrative embodiments, specific examples are presented which employ certain GaAs polycrystalline materials with low concentration of oxygen content. However, it may be appreciated by those skilled in the semiconductor art that some other causes may be considered for letting the prescribed interface oxygen concentration increase. For instance, a decrease in purity of ambient gas used is one possible cause. An insufficiency of refining or purification of graphite tools is another possible cause. An accidental oxidization of original materials and/or dopants is a further cause. Avoiding these causes may enable an improvement in interface oxygen concentration.

Furthermore, while the illustrative embodiments are described hereinbefore based on specific examples employing GaAlAs as the compound semiconductor thereof, it may be appreciated by those skilled in the art that the compound semiconductor may alternatively comprises other equivalent semiconductive materials, including, but not limited to, GaAs and GaP, GaInP.

As has been described, the present invention provides a specific epitaxial wafer with double-heterostructure or with a rear-surface reflection structure, wherein the interface between the p-type compound semiconductor clad layer and the p-type compound semiconductor active layer and the interface between the p-type compound semiconductor active layer and the n-type compound semiconductor clad layer are each less than or equal to $1 \times 10^{17}$ cm$^{-3}$ in oxygen concentration, thereby enabling resultant light emission luminance to increase by 30% or thereabouts.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A double-heterostructure epitaxial semiconductor device comprising:

a compound semiconductor substrate of a predefined type of conductivity;

a multilayer lamination on said substrate, said lamination including a first compound semiconductor clad layer of the predefined conductivity type, a compound semiconductor active layer of said predefined conductivity type, and a second compound semiconductor clad layer of a conductivity opposite said predefined conductivity type;

the first clad layer and the active layer having a first interface as defined therebetween;

said active layer and the second clad layer having a second interface therebetween; and each of the first and second interfaces being less than or equal to $1 \times 10^{17}$ atoms per cubic centimeter (cm$^{-3}$) in oxygen concentration.

2. The device of claim 1 wherein said substrate and the compound semiconductor layers include one selected from the group consisting of gallium arsenide (GaAs), gallium phosphide (GaP), and gallium indium phosphide (GaInP).

3. The device of claim 2 wherein the first conductivity type is p-type whereas the second conductivity type is n-type.

4. An epitaxial semiconductor device with rear-surface reflection structure, said device comprising:

a first compound semiconductor clad layer of a first type of conductivity;

a multilayer lamination on the first clad layer, said lamination including a compound semiconductor active layer of the first conductivity type and a second compound semiconductor clad layer of a second type of conductivity;

said first clad layer and said active layer having a first interface as defined therebetween;

said active layer and the second clad layer having a second interface therebetween; and each of the first and second interfaces being less than or equal to $1 \times 10^{17}$ cm$^{-3}$ in oxygen concentration.

5. The device of claim 4 wherein the compound semiconductor layers include one selected from the group consisting of GaAlAs, GaP and GaInP.

6. The device of claim 5 wherein the first conductivity type is p-type whereas the second conductivity type is n-type.

7. A light-emitting diode making use of an epitaxial wafer of a rear-surface reflection type, said wafer comprising:

a first compound semiconductor clad layer of a first conductivity type;

a multilayer lamination on the first clad layer, said lamination including a compound semiconductor active layer of the first conductivity type and a second compound semiconductor clad layer of a second conductivity type;

said first clad layer and said active layer having a first interface as therebetween;

said active layer and the second clad layer having a second interface therebetween;

each of the first and second interfaces being less than or equal to $1 \times 10^{17}$ cm$^{-3}$ in oxygen concentration;

an anode electrode on said first clad layer; and a cathode electrode on said second clad layer.

8. The diode of claim 7 wherein the first conductivity type is p-type whereas the second conductivity type is n-type.

* * * * *